United States Patent
Shirahama et al.

(10) Patent No.: US 12,527,126 B2
(45) Date of Patent: Jan. 13, 2026

(54) LIGHT-EMITTING ELEMENT INCLUDING P-SIDE SEMICONDUCTOR LAYER HAVING FIRST, SECOND, AND THIRD LAYERS

(71) Applicant: NICHIA CORPORATION, Anan (JP)

(72) Inventors: Tatsuo Shirahama, Anan (JP); Naoya Iwai, Anan (JP); Shingo Kanehira, Anan (JP); Takanori Fukumori, Tokushima (JP)

(73) Assignee: NICHIA CORPORATION, Anan (JP)

( * ) Notice: Subject to any disclaimer, the term of this patent is extended or adjusted under 35 U.S.C. 154(b) by 581 days.

(21) Appl. No.: 17/899,027

(22) Filed: Aug. 30, 2022

(65) Prior Publication Data
US 2023/0070127 A1 Mar. 9, 2023

(30) Foreign Application Priority Data
Sep. 8, 2021 (JP) .................. 2021-146483

(51) Int. Cl.
*H10H 20/825* (2025.01)
*H10H 20/81* (2025.01)
*H10H 20/812* (2025.01)

(52) U.S. Cl.
CPC ........ *H10H 20/825* (2025.01); *H10H 20/812* (2025.01); *H10H 20/8215* (2025.01)

(58) Field of Classification Search
CPC ............... H10H 20/825; H10H 20/812; H10H 20/8215
See application file for complete search history.

(56) References Cited

U.S. PATENT DOCUMENTS

| | | |
|---|---|---|
| 9,147,800 B2 | 9/2015 | Lai et al. |
| 2002/0093020 A1 | 7/2002 | Edmond et al. |
| 2002/0195606 A1 | 12/2002 | Edmond et al. |
| 2003/0006418 A1 | 1/2003 | Emerson et al. |
| 2005/0040426 A1 | 2/2005 | Edmond et al. |
| 2005/0045895 A1 | 3/2005 | Emerson et al. |

(Continued)

FOREIGN PATENT DOCUMENTS

| | | | | |
|---|---|---|---|---|
| CN | 100449808 C | * | 1/2009 | ............. B82Y 20/00 |
| JO | 3658112 B2 | * | 6/2005 | ............. B82Y 20/00 |

(Continued)

*Primary Examiner* — Eliseo Ramos Feliciano
*Assistant Examiner* — Timothy Edward Duren
(74) *Attorney, Agent, or Firm* — Foley & Lardner LLP

(57) ABSTRACT

A light-emitting element includes: a semiconductor structure including: an n-side semiconductor layer including an n-type nitride semiconductor layer; a p-side semiconductor layer including a p-type nitride semiconductor layer; and an active layer disposed between the n-side semiconductor layer and the p-side semiconductor, the active layer including a well layer made of a nitride semiconductor. The p-side semiconductor layer includes, in order from an active layer side, a first layer including Ga, Al, In, and N, a second layer containing Ga, Al, and N, and a third layer including Ga and N, the second layer being thinner than the first layer. A bandgap energy of the second layer is larger than a bandgap energy of the well layer. A p-type impurity concentration of the third layer is higher than a p-type impurity concentration of the first layer. A composition ratio of Al in the second layer is higher than a composition ratio of Al in the first layer.

16 Claims, 3 Drawing Sheets

(56) References Cited

U.S. PATENT DOCUMENTS

| | | |
|---|---|---|
| 2005/0056824 A1 | 3/2005 | Bergmann et al. |
| 2006/0233211 A1 | 10/2006 | Edmond et al. |
| 2006/0246612 A1 | 11/2006 | Emerson et al. |
| 2007/0290230 A1 | 12/2007 | Kawaguchi et al. |
| 2008/0038858 A1 | 2/2008 | Emerson et al. |
| 2008/0203418 A1* | 8/2008 | Yanamoto ............... B82Y 20/00 257/E33.001 |
| 2009/0029493 A1 | 1/2009 | Emerson et al. |
| 2010/0133508 A1 | 6/2010 | Bergmann et al. |
| 2010/0238963 A1 | 9/2010 | Tanaka |
| 2011/0198583 A1* | 8/2011 | Nago ..................... B82Y 20/00 257/77 |
| 2011/0272670 A1 | 11/2011 | Kawaguchi et al. |
| 2012/0018701 A1 | 1/2012 | Bergmann et al. |
| 2012/0298955 A1 | 11/2012 | Emerson et al. |
| 2013/0223463 A1 | 8/2013 | Kawaguchi et al. |
| 2013/0341593 A1 | 12/2013 | Bergmann et al. |
| 2015/0084069 A1 | 3/2015 | Kushibe et al. |
| 2017/0125632 A1 | 5/2017 | Watabe |
| 2022/0045239 A1 | 2/2022 | Watanabe |
| 2022/0131043 A1* | 4/2022 | Matsukura ......... H10H 20/8162 |

FOREIGN PATENT DOCUMENTS

| | | | | |
|---|---|---|---|---|
| JP | 2001-077480 A | | 3/2001 | |
| JP | 2002-261396 A | | 9/2002 | |
| JP | 2004247503 A | * | 9/2004 | |
| JP | 3658112 B2 | * | 6/2005 | ............. B82Y 20/00 |
| JP | 2006-245165 A | | 9/2006 | |
| JP | 2007-012729 A | | 1/2007 | |
| JP | 2008-508720 A | | 3/2008 | |
| JP | 2008-539585 A | | 11/2008 | |
| JP | 2010-219269 A | | 9/2010 | |
| JP | 2012-015535 A | | 1/2012 | |
| JP | 2012-138626 A | | 7/2012 | |
| JP | 5380516 B2 | * | 1/2014 | ............. H01L 33/06 |
| JP | 2015-065245 A | | 4/2015 | |
| JP | 2021-027324 A | | 2/2021 | |
| KR | 101998763 B1 | | 7/2019 | |
| WO | WO-2005/034301 A | | 4/2005 | |
| WO | WO-2016/002419 A1 | | 1/2016 | |
| WO | WO-2020/122137 A1 | | 6/2020 | |
| WO | WO-2021260529 A1 | * | 12/2021 | ........... H10H 20/825 |

* cited by examiner

LIGHT-EMITTING ELEMENT INCLUDING P-SIDE SEMICONDUCTOR LAYER HAVING FIRST, SECOND, AND THIRD LAYERS

CROSS-REFERENCE TO RELATED APPLICATIONS

This application claims priority to Japanese Patent Application No. 2021-146483, filed on Sep. 8, 2021, the disclosure of which is hereby incorporated by reference in its entirety.

BACKGROUND

Field of the Invention

The present disclosure relates to a light-emitting element.

Description of the Related Art

JP 2001-077480 A discloses a light-emitting element composed of a plurality of stacked layers of nitride semiconductors. In such a light-emitting element, it is desired to improve the light extraction efficiency.

SUMMARY

It is an object of certain embodiments of the present disclosure to provide a light-emitting element with high light extraction efficiency.

According to one embodiment, a light-emitting element has a semiconductor structure including: an n-side semiconductor layer including an n-type nitride semiconductor layer; a p-side semiconductor layer including a p-type nitride semiconductor layer; and an active layer disposed between the n-side semiconductor layer and the p-side semiconductor, the active layer including a well layer made of a nitride semiconductor, wherein the p-side semiconductor layer includes a first layer containing Ga, Al, In, and N, a second layer containing Ga, Al, and N, and a third layer containing Ga and N in order from the active layer side, the second layer being thinner than the first layer, wherein a bandgap energy of the second layer is larger than a bandgap energy of the well layer, wherein a p-type impurity concentration of the third layer is higher than a p-type impurity concentration of the first layer, and wherein a composition ratio of Al in the second layer is higher than a composition ratio of Al in the first layer.

According to certain embodiments of the present disclosure, the light-emitting element with high light extraction efficiency can be provided.

DETAILED DESCRIPTION

Figure 1:
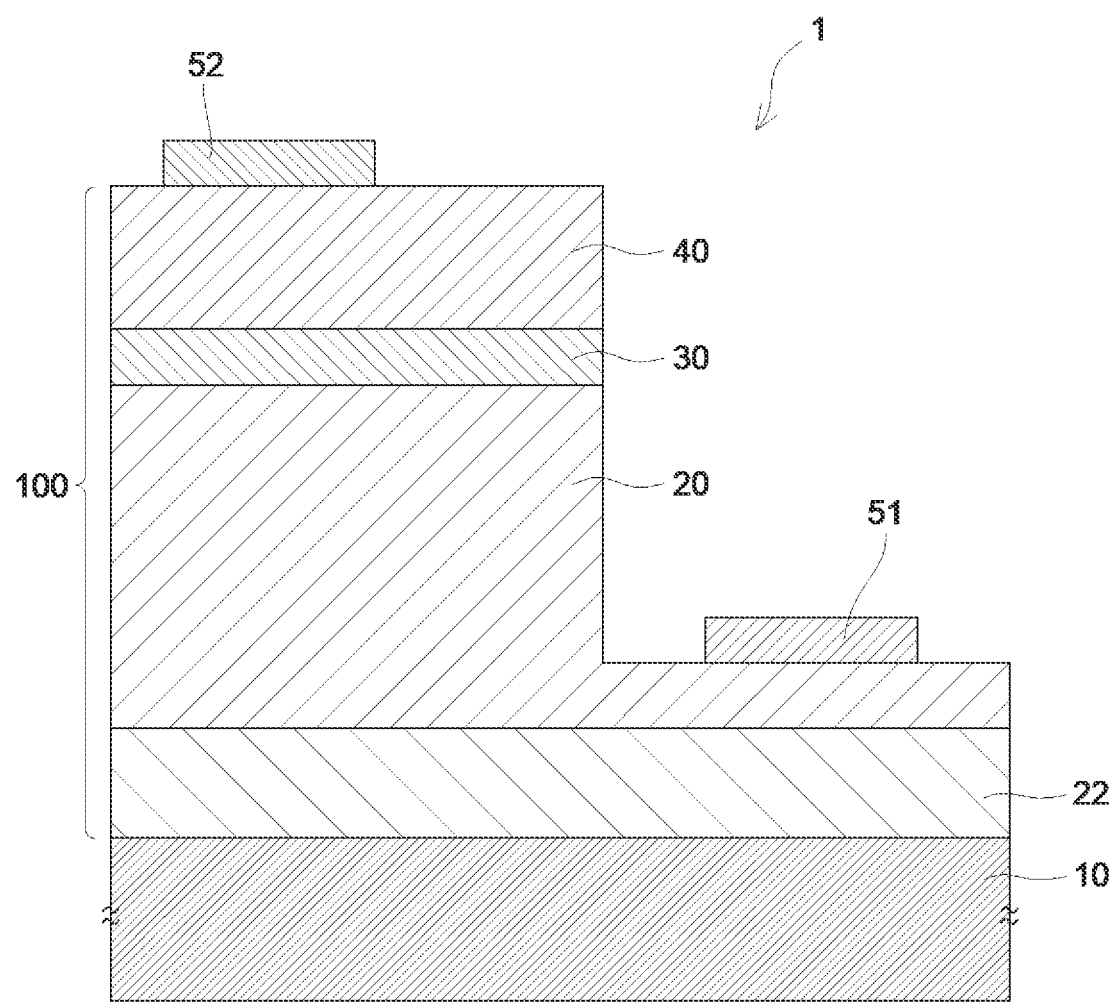
FIG. 1 is a schematic cross-sectional view showing the configuration of a light-emitting element according to an embodiment of the present disclosure.

Hereinafter, embodiments of a light-emitting element according to the present disclosure will be described. It is noted that, because the drawings referred to in the description below schematically illustrate the embodiments, the scales, the intervals, the positional relations, and the like of respective members may be exaggerated, or illustration of part of the members may be omitted. In the following description, the same names and reference characters designate the same or similar members in principle, and a detailed explanation thereof will be omitted as appropriate.

Figure 2A:
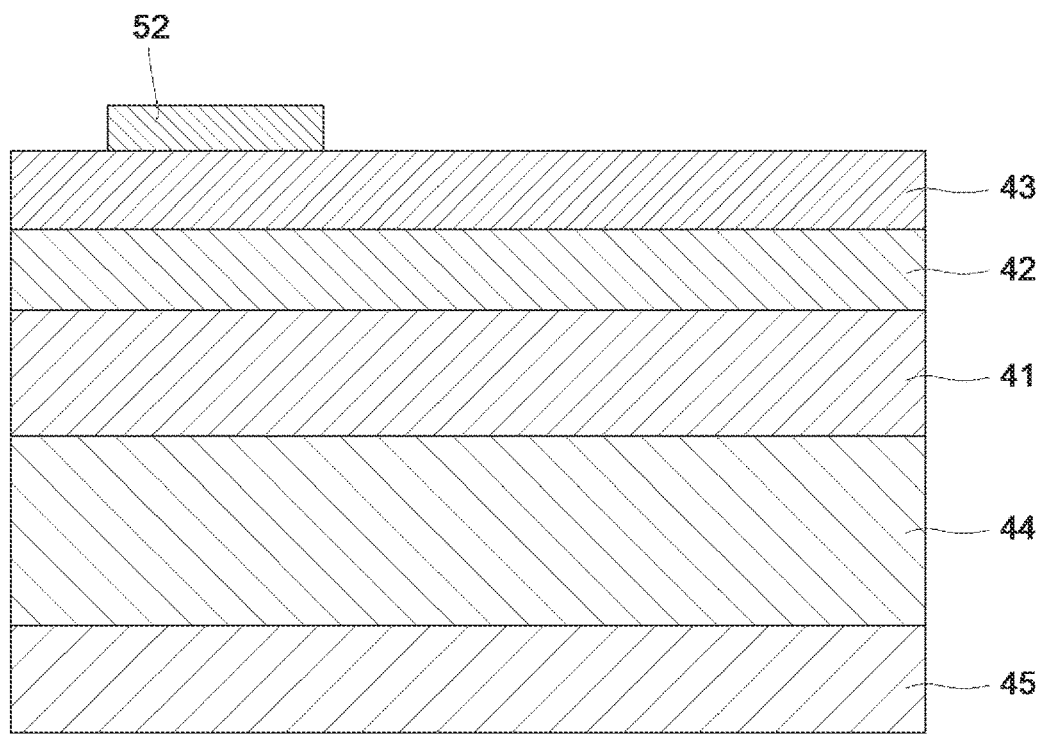
FIG. 2A is a schematic cross-sectional view showing the configuration of the light-emitting element according to an embodiment of the present disclosure.
Figure 2B:
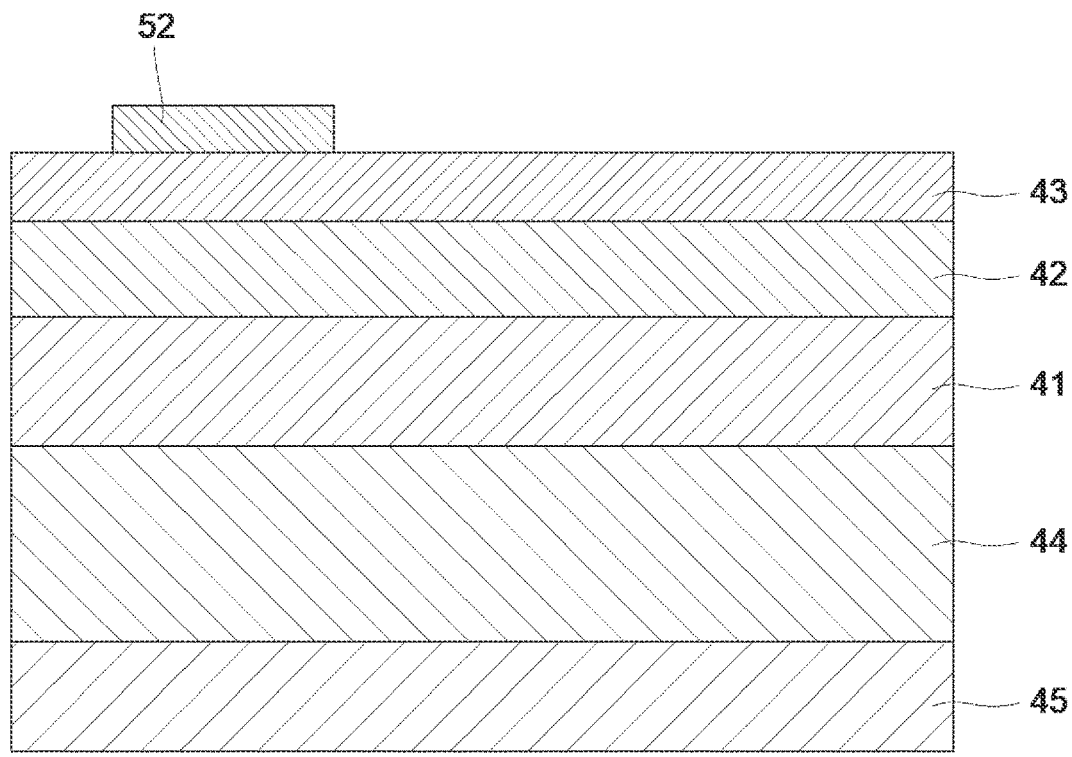
FIG. 2B is a schematic cross-sectional view showing another configuration of the light-emitting element according to an embodiment of the present disclosure.
Figure 3:
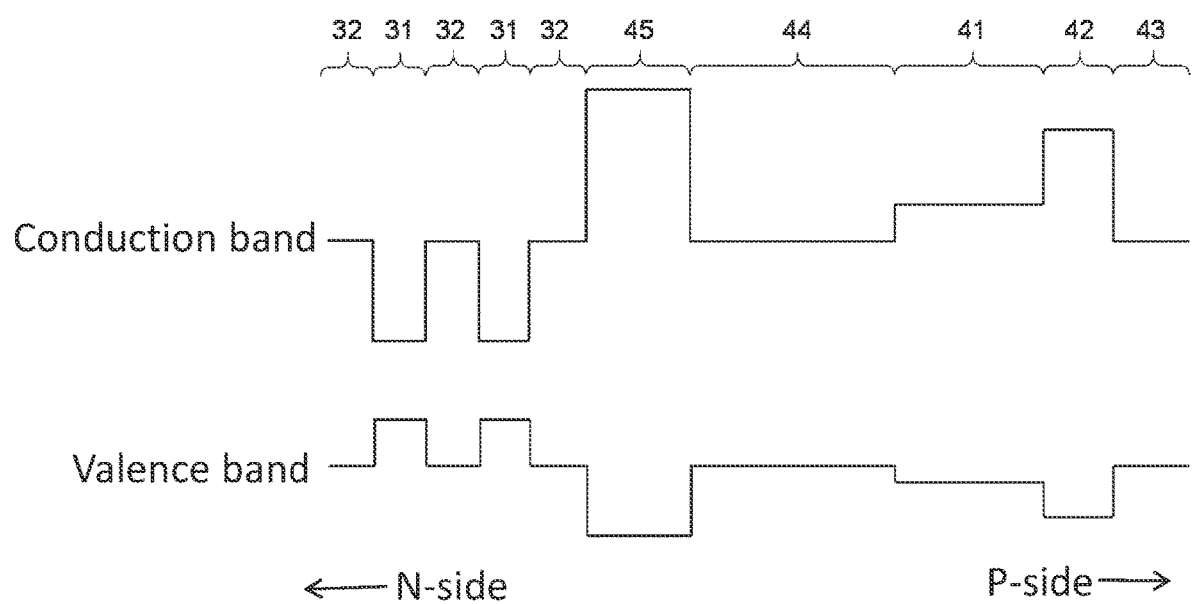
FIG. 3 is a band diagram schematically showing the band structure of the light-emitting element according to an embodiment of the present disclosure.

FIG. 1 is a schematic cross-sectional view of a light-emitting element 1. FIGS. 2A and 2B are schematic cross-sectional views showing a stacked structure of a p-side semiconductor layer 40. FIG. 3 is a band diagram schematically showing the band structure of an active layer 30 and the p-side semiconductor layer 40.

As shown in FIG. 1, the light-emitting element 1 has a substrate 10 and a semiconductor structure 100 disposed on the substrate 10. The semiconductor structure 100 includes an n-side semiconductor layer 20, the p-side semiconductor layer 40, and the active layer 30 disposed between the n-side semiconductor layer 20 and the p-side semiconductor layer 40. The light-emitting element 1 has an n-electrode 51 electrically connected to the n-side semiconductor layer 20, and a p-electrode 52 electrically connected to the p-side semiconductor layer 40.

The material of the substrate 10 can be, for example, sapphire, silicon, SiC, GaN, etc. A buffer layer may be disposed on the substrate 10 between the semiconductor structure 100 and the substrate 10. For example, a layer made of AlGaN or AlN can be used as the buffer layer. Finally, the substrate 10 may be removed.

The semiconductor structure 100 is a stacked body composed of a plurality of semiconductor layers made of nitride semiconductors. The nitride semiconductors are semiconductors containing nitrogen and can include semiconductors having all possible compositions in which composition ratios x and y are varied within respective specified ranges in a chemical formula given by $In_xAl_yGa_{1-x-y}N$ ($0 \leq x \leq 1$, $0 \leq y \leq 1$, $x+y \leq 1$).

An underlayer 22 is disposed between the substrate 10 and the n-side semiconductor layer 20. The underlayer 22 is, for example, an undoped GaN layer. The thickness of the underlayer 22 can be set at, for example, 5 μm or more and 10 μm or less. It is noted that the underlayer 22 may be omitted. The undoped layer as used herein refers to a layer with no n-type impurity or p-type impurity doped intentionally. When the undoped layer is located adjacent to a layer intentionally doped with an n-type impurity and/or a p-type impurity, the undoped layer may contain the n-type impurity and/or p-type impurity due to diffusion of the impurity from its adjacent layer or the like. It is noted that the thickness of each semiconductor layer as used herein refers to a thickness of the semiconductor structure 100 in its stacking direction.

The n-side semiconductor layer 20 includes one or more n-type nitride semiconductor layers. Examples of the n-type nitride semiconductor layer include nitride semiconductor layers containing n-type impurities such as silicon (Si) and germanium (Ge). The n-type nitride semiconductor layer is, for example, a layer made of GaN that contains gallium (Ga) and nitrogen (N), and it may also contain indium (In) and/or aluminum (Al). For example, the n-type impurity concentration of the n-type nitride semiconductor layer that contains Si as the n-type impurity is $1 \times 10^{18}/cm^3$ or more and $2 \times 10^{19}/cm^3$ or less. The n-side semiconductor layer 20 may include an undoped layer as long as it has the function of supplying electrons. The n-side semiconductor layer 20 may include a superlattice layer composed of a plurality of semiconductor layers that are made of different materials and alternately stacked.

The n-side semiconductor layer 20 has a top surface where no other semiconductor layer is disposed. The n-electrode 51 is disposed on the top surface of the n-side semiconductor layer 20 where no other semiconductor layer is disposed.

The active layer 30 is disposed between the n-side semiconductor layer 20 and the p-side semiconductor layer 40. The active layer 30 includes a well layer 31 and a barrier layer 32. The active layer 30 has, for example, a multiple quantum well structure that includes a plurality of well layers 31 and a plurality of barrier layers 32. As shown in FIG. 3, the bandgap energy of the barrier layer 32 is larger than the bandgap energy of the well layer 31. Light with a wavelength corresponding to the bandgap energy of the well layers 31 is emitted from the well layers 31 included in the active layer 30. As the well layer 31, a layer made of, for example, InGaN, GaN, or AlGaN is used. As the barrier layer 32, a layer made of, for example, GaN or AlGaN is used. The well layer 31 and the barrier layer 32 included in the active layer 30 are, for example, undoped layers. An n-type impurity and/or p-type impurity may be contained in at least a part of the well layer 31 and the barrier layer 32 included in the active layer 30.

The light emitted from the active layer 30 is, for example, ultraviolet or visible light. The active layer 30 can emit, for example, blue light or green light as the visible light. The peak emission wavelength of blue light is 430 nm or higher and 490 nm or lower. The peak emission wavelength of green light is 500 nm or higher and 540 nm or lower. The peak emission wavelength of ultraviolet light is 400 nm or lower.

The p-side semiconductor layer 40 includes one or more p-type nitride semiconductor layers. Examples of the p-type nitride semiconductor layer include nitride semiconductor layers containing a p-type impurity such as magnesium (Mg). As shown in FIG. 2A, the p-side semiconductor layer 40 has a first layer 41, a second layer 42, and a third layer 43 in order from the active layer 30 side. The p-side semiconductor layer 40 may further have a fourth layer 44 disposed between the active layer 30 and the first layer 41, and a fifth layer 45 disposed between the active layer 30 and the fourth layer 44.

The first layer 41 is a nitride semiconductor layer containing Ga, Al, and In. The second layer 42 is a nitride semiconductor layer containing Ga and Al. The third layer 43 is a nitride semiconductor layer containing Ga. The fourth layer 44 is a nitride semiconductor layer containing Ga. The fifth layer 45 is a nitride semiconductor layer containing Ga and Al. For example, it has both a nitride semiconductor layer containing Ga and a nitride semiconductor layer containing Ga and Al. The first layer 41 is a layer made of AlInGaN, for example. The second layer 42 is a layer made of AlGaN, for example. The third layer 43 is a layer made of GaN, for example. The fourth layer 44 is a layer made of GaN, for example. The fifth layer 45 includes a layer made of AlGaN or GaN, for example.

By disposing the first layer 41 composed of the nitride semiconductor layer containing Ga, Al, and In on the active layer 30, V-pits formed on the top surface of the semiconductor layer obtained after the formation of the active layer 30 can be easily filled. This is presumed to be because, when the first layer 41 is formed, the inclusion of Al and In promotes the growth of the material of the first layer 41 in the V-pits, making it easier to fill the V-pits than, for example, when a layer made of only GaN is formed. It is noted that the V-pit refers to a recess formed on the top surface of a semiconductor layer. The V-pits can be easily filled in this way, thus reducing heat damage to the active layer 30 due to the formation of the first layer 41, the second layer 42, and the third layer 43 with the entire top surface of the active layer 30 exposed. As a result, the deterioration of the crystallinity of the active layer 30 can be reduced, thereby increasing the luminous efficiency of the light-emitting element 1.

The p-type impurity concentration of the third layer 43 is higher than the p-type impurity concentration of the first layer 41. By making the p-type impurity concentration of the third layer 43 higher, holes can be easily supplied from the p-side semiconductor layer 40 to the active layer 30, thereby increasing the luminous efficiency of the light-emitting element 1. The p-type impurity concentration of the second layer 42 and the third layer 43 is preferably higher than the p-type impurity concentration of the first layer 41. This can supply holes from the p-side semiconductor layer 40 to the active layer 30 much more easily than when only the third layer 43 is disposed. The p-type impurity concentration of the second layer 42 and the third layer 43 is, for example, $1\times10^{20}/cm^3$ or more and $5\times10^{20}/cm^3$ or less. The first layer 41 is composed of, for example, an undoped layer. The p-type impurity concentration of the first layer 41 is, for example, $5\times10^{18}/cm^3$ or more and $3\times10^{19}/cm^3$ or less.

The p-type impurity concentration of the second layer 42 is preferably lower than the p-type impurity concentration of the third layer 43. By making the p-type impurity concentration of the second layer 42 lower, a decrease in the light transmittance in the second layer 42 that would be caused by the inclusion of the p-type impurity at a high concentration can be reduced. Thus, the absorption of light emitted from the active layer 30 in the second layer 42 can be reduced, thereby increasing the light extraction efficiency, compared to when the p-type impurity concentration of the second layer 42 is set the same as that of the third layer 43. When the p-type impurity concentration of the second layer 42 is lower than that of the third layer 43, the p-type impurity concentration of the second layer 42 can be set at 60% or more and 80% or less of that of the third layer 43. Specifically, the p-type impurity concentration of the second layer 42 can be $1\times10^{20}/cm^3$ or more and $3\times10^{20}/cm^3$ or less, whereas the p-type impurity concentration of the third layer 43 can be $3\times10^{20}/cm^3$ or more and $5\times10^{20}/cm^3$ or less.

The second layer 42 is composed of a nitride semiconductor layer containing Al and has a bandgap energy larger than the bandgap energy of the well layer 31 in the active layer 30 as shown in FIG. 3. The second layer 42 is a nitride semiconductor layer that has the large bandgap energy, compared to the well layer 31 made of InGaN, for example, and is less likely to absorb light emitted from the active layer 30. By arranging such a second layer 42, the absorption of the light emitted from the active layer 30 can be reduced, thereby increasing the light extraction efficiency. Each of the first layer 41 and the second layer 42 preferably has a bandgap energy larger than the bandgap energy of the well layer 31 in the active layer 30 as shown in FIG. 3. By arranging such a first layer 41, like the second layer 42 mentioned above, the absorption of the light emitted from the active layer 30 can be reduced, thereby increasing the light extraction efficiency. It is noted that the bandgap energy of the well layer 31 in the active layer 30 is calculated form the peak emission wavelength of the light emitted from the active layer 30. When the peak emission wavelength of the light emitted from the active layer 30 is, for example, 450 nm, the bandgap energy of the well layer 31 in the active layer 30 is calculated to be approximately 2.76 eV from the following: Bandgap energy [eV]=1240/Peak emission wavelength [nm]. The bandgap energy of each nitride semiconductor layer is calculated from the composition ratios of the materials constituting the nitride semiconductor layer.

The composition ratio of Al in the second layer 42 is higher than the composition ratio of Al in the first layer 41. For example, when the first layer 41 is made of $In_{x1}Al_{y1}Ga_{1-x1-y1}N$ and the second layer 42 is made of $In_{x2}Al_{y2}Ga_{1-x2-y2}N$, y1 is larger than y2. This allows the bandgap energy of the second layer 42 to be larger than the bandgap energy of the first layer 41, reducing the absorption of the light emitted from the active layer 30 in the second layer 42.

The second layer 42 is composed of a nitride semiconductor layer that has a higher composition ratio of Al than the first layer 41. When such a second layer 42 is formed on a GaN layer, for example, lattice relaxation may occur due to a difference in the lattice constant between the second layer 42 and the GaN layer, and thus the crystallinity of the second layer 42 may deteriorate. In the present embodiment, the second layer 42 is formed on the first layer 41, which has a lower composition ratio of Al than the second layer 42, to decrease the difference in the lattice constant between the first layer 41 and the second layer 42, thus reducing the occurrence of lattice relaxation. This can improve the crystallinity of the second layer 42 and the third layer 43 disposed on the second layer 42.

A difference in the composition ratio of Al between the first layer 41 and the second layer 42 is preferably 5% or more and 10% or less. By setting a difference in the composition ratio of Al between the first layer 41 and the second layer 42 to 5% or more, the absorption of the light emitted from the active layer 30 in the second layer 42 can be reduced easily. By setting a difference in the composition ratio of Al between the first layer 41 and the second layer 42 to 10% or less, the occurrence of lattice relaxation due to the first and second layers 41 and 42 is reduced, so that the second layer 42 with good crystallinity can be formed.

The composition ratio of Al in the first layer 41 can be set at, for example, 1% or more and 4% or less. The composition ratio of Al in the second layer 42 can be set at, for example, 3% or more and 10% or less. For example, the composition ratio of Al in the first layer 41 can be set at about 3%, and the composition ratio of Al in the second layer 42 can be set at about 8%.

The composition ratio of In in the first layer 41 is preferably 1% or more and 3% or less. By setting the composition ratio of In in the first layer 41 to 1% or more, the effect of filling V-pits formed on the top surface of the fourth layer 44 with the first layer 41 can be achieved easily. By setting the composition ratio of In in the first layer 41 to 3% or less, the deterioration of the crystallinity of the first layer 41 can be reduced.

The thickness of the second layer 42 is smaller than the thickness of the first layer 41. The deterioration of the crystallinity of the p-side semiconductor layer 40 can be reduced by relatively thinly forming the second layer 42 that has a higher composition ratio of Al than the first layer 41 and is likely to deteriorate its crystallinity.

The thickness of the second layer 42 can be greater than or equal to the thickness of the third layer 43, and the thickness of the second layer 42 is preferably greater than the thickness of the third layer 43 as shown in FIG. 2B. Thus, the absorption of the light emitted from the active layer 30 can be reduced more than when the second layer 42 and the third layer 43 have the same thickness, thereby increasing the light extraction efficiency. The thickness of the second layer 42 can be set at, for example, 60% or more and 80% or less of the total thickness of the second layer 42 and the third layer 43. The light extraction efficiency can be increased by setting the thickness of the second layer 42 to 60% or more of the total thickness of the second layer 42 and the third layer 43. Further, the deterioration of the crystallinity due to the formation of the thicker second layer 42 having a high p-type impurity concentration and containing Al can be reduced by setting the thickness of the second layer 42 to 80% or less of the total thickness of the second layer 42 and the third layer 43. The thickness of the second layer 42 can be set at, for example, 6 nm or more and 10 nm or less. The thickness of the third layer 43 can be set at, for example, 8 nm or more and 12 nm or less.

The fourth layer 44 is disposed on the top surface of the fifth layer 45. The fourth layer 44 is preferably thicker than the first layer 41. The first layer 41 is disposed on the top surface of the fourth layer 44. V-pits formed on the top surface of the semiconductor layer obtained after the formation of the active layer 30 are filled with the fourth layer 44, and V-pits formed on the top surface of the fourth layer 44 are further filled with the first layer 41. Thus, by disposing the fourth layer 44 that contains Ga and is thicker than the first layer 41 before disposing the first layer 41, the V-pits formed on the top surface of the semiconductor layer obtained after the formation of the active layer 30 can be filled more easily than when only the first layer 41 is disposed. The thickness of the first layer 41 can be set at, for example, 15 nm or more and 25 nm or less. The thickness of the fourth layer 44 can be set at, for example, 20 nm or more and 40 nm or less. It is noted that the fourth layer 44 may be omitted.

The fourth layer 44 is a layer made of undoped GaN, for example. The p-type impurity concentration of the fourth layer 44 is, for example, $5\times10^{18}/cm^3$ or more and $3\times10^{19}/cm^3$ or less. It is noted that the fourth layer 44 may be omitted.

The fifth layer 45 is disposed on the top surface of the active layer 30. The fifth layer 45 is disposed so as to confine carriers within the active layer 30. The fifth layer 45 can have a stacked structure composed of, for example, a GaN layer containing a p-type impurity and an AlGaN layer containing a p-type impurity. The p-type impurity concentration of the fifth layer 45 is preferably higher than the p-type impurity concentration of the first layer 41, the second layer 42, and the third layer 43. The p-type impurity concentration of the fifth layer 45 is, for example, $5\times10^{19}/cm^3$ or more and $3\times10^{20}/cm^3$ or less. It is noted that the fifth layer 45 may be omitted.

The composition ratio of Al in the AlGaN layer included in the fifth layer 45 is higher than each of the composition ratios of Al in the first layer 41 and the second layer 42. Thus, carriers can be confined within the active layer 30, improving the luminous efficiency. As shown in FIG. 3, the bandgap energy of the fifth layer 45 is larger than the bandgap energy of the second layer 42. The composition ratio of Al in the AlGaN layer included in the fifth layer 45 is preferably, for example, 30% or more and 40% or less. The thickness of the fifth layer 45 can be set at, for example, 10 nm or more and 20 nm or less.

The n-electrode 51 is disposed on the n-side semiconductor layer 20 and electrically connected to the n-side semiconductor layer 20. The p-electrode 52 is disposed on the third layer 43 of the p-side semiconductor layer 40 and electrically connected to the p-side semiconductor layer 40. Examples of the materials for the n-electrode 51 and the p-electrode 52 can include metals such as Ag, Al, Ni, Rh, Au, Cu, Ti, Pt, Pd, Mo, Cr, and W, or alloys containing such a metal as a major component. Each of the n-electrode 51 and the p-electrode 52 can have a stacked structure including a Ti layer and an Au layer, for example.

When the forward voltage is applied between the n-electrode 51 and the p-electrode 52, the forward voltage is applied between the p-side semiconductor layer 40 and the n-side semiconductor layer 20, whereby holes and electrons are supplied to the active layer 30, causing the active layer 30 to emit light.

As described above, according to the light-emitting element of the embodiment, the light extraction efficiency can be increased by disposing the first and second layers 41 and 42 that have the larger bandgap energy than the well layer 31. Furthermore, by providing the first layer 41, V-pits formed on the top surface of the semiconductor layer obtained after the formation of the active layer 30 are easily filled, so that heat damage to the active layer 30 can be reduced, thereby increasing the luminous efficiency of the light-emitting element 1.

The embodiments of the present invention have been described with reference to specific examples. However, the present invention is not limited to these specific examples. All forms of the present invention that can be changed in design and implemented by those skilled in the art as appropriate based on the above embodiments also fall within the scope of the present invention as long as they encompass the spirit of the present invention. In addition, those skilled in the art can conceive of various other changes and modifications within the idea of the present invention, and these changes and modifications also fall within the scope of the present invention.

What is claimed is:

1. A light-emitting element comprising:
a semiconductor structure comprising:
an n-side semiconductor layer comprising an n-type nitride semiconductor layer;
a p-side semiconductor layer comprising a p-type nitride semiconductor layer; and
an active layer disposed between the n-side semiconductor layer and the p-side semiconductor layer, the active layer comprising a well layer made of a nitride semiconductor; wherein:
the p-side semiconductor layer comprises, in order from an active layer side:
a first layer comprising Ga, Al, In, and N,
a second layer containing Ga, Al, and N, and
a third layer comprising Ga and N, the second layer being thinner than the first layer;
a bandgap energy of the second layer is larger than a bandgap energy of the well layer;
a p-type impurity concentration of the third layer is higher than a p-type impurity concentration of the first layer;
a composition ratio of Al in the second layer is higher than a composition ratio of Al in the first layer
the p-side semiconductor layer further comprises:
a fourth layer comprising Ga, the fourth layer disposed between the active layer and the first layer, and
a fifth layer having a bandgap energy larger than a bandgap energy of the second layer, the fifth layer disposed between the active layer and the fourth layer; and
a thickness of the fourth layer is larger than a thickness of the first layer.

2. The light-emitting element according to claim 1, wherein:
a bandgap energy of the first layer is larger than the bandgap energy of the well layer.

3. The light-emitting element according to claim 1, wherein:
a p-type impurity concentration of the second layer is higher than the p-type impurity concentration of the first layer.

4. The light-emitting element according to claim 2, wherein:
a p-type impurity concentration of the second layer is higher than the p-type impurity concentration of the first layer.

5. The light-emitting element according to claim 2, wherein:
a p-type impurity concentration of the second layer is lower than the p-type impurity concentration of the third layer.

6. The light-emitting element according to claim 2, wherein:
a difference between the composition ratio of Al in the first layer and the composition ratio of Al in the second layer is 5% or more and 10% or less.

7. The light-emitting element according to claim 2, wherein:
a thickness of the second layer is 60% or more and 80% or less of a total thickness of the second layer and the third layer.

8. The light-emitting element according to claim 2, wherein:
a peak emission wavelength of light emitted from the active layer is 430 nm or more and 490 nm or less.

9. The light-emitting element according to claim 2, further comprising:
an n-electrode electrically connected to the n-side semiconductor layer; and
a p-electrode electrically connected to the third layer.

10. The light-emitting element according to claim 1, wherein:
a p-type impurity concentration of the second layer is lower than the p-type impurity concentration of the third layer.

11. The light-emitting element according to claim 3, wherein:
a p-type impurity concentration of the second layer is lower than the p-type impurity concentration of the third layer.

12. The light-emitting element according to claim 3, further comprising:
an n-electrode electrically connected to the n-side semiconductor layer; and
a p-electrode electrically connected to the third layer.

13. The light-emitting element according to claim 1, wherein:
a difference between the composition ratio of Al in the first layer and the composition ratio of Al in the second layer is 5% or more and 10% or less.

14. The light-emitting element according to claim 1, wherein:
a thickness of the second layer is 60% or more and 80% or less of a total thickness of the second layer and the third layer.

15. The light-emitting element according to claim 1, wherein:
a peak emission wavelength of light emitted from the active layer is 430 nm or more and 490 nm or less.

16. The light-emitting element according to claim 1, further comprising:
   an n-electrode electrically connected to the n-side semiconductor layer; and
   a p-electrode electrically connected to the third layer.

* * * * *